United States Patent [19]
Ruppi

[11] Patent Number: 5,137,774
[45] Date of Patent: Aug. 11, 1992

[54] MULTI-OXIDE COATED CARBIDE BODY AND METHOD OF PRODUCING THE SAME

[75] Inventor: Sakari A. Ruppi, Fagersta, Sweden
[73] Assignee: Seco Tools AB, Fagersta, Sweden
[21] Appl. No.: 552,222
[22] Filed: Jul. 13, 1990
[30] Foreign Application Priority Data
  Jul. 13, 1989 [EP] European Pat. Off. .......... 89850230
[51] Int. Cl.⁵ .................. B32B 9/00; B32B 19/00
[52] U.S. Cl. ................. 428/216; 428/212; 428/336; 428/408; 428/469; 428/472; 428/698; 428/699; 428/701; 428/702; 428/704
[58] Field of Search ............. 428/698, 697, 699, 701, 428/457, 469, 472, 702, 704, 408, 212, 216, 336

[56] References Cited

U.S. PATENT DOCUMENTS

| Re. 29,420 | 9/1977 | Lindstrom et al. | 428/336 |
|---|---|---|---|
| Re. 31,526 | 2/1984 | Smith et al. | 428/469 |
| Re. 32,110 | 4/1986 | Hale | 428/336 |
| 3,640,689 | 2/1972 | Glaski et al. | 428/472 |
| 3,836,392 | 9/1974 | Lux et al. | 428/472 |
| 4,018,631 | 4/1977 | Hale | 428/702 |
| 4,180,400 | 12/1979 | Smith et al. | 428/469 |
| 4,239,536 | 12/1980 | Yamamoto et al. | 75/238 |
| 4,357,382 | 11/1982 | Lambert et al. | 428/698 |
| 4,619,866 | 10/1986 | Smith et al. | 428/702 |

OTHER PUBLICATIONS

Vuormen et al. "Characterization of $\alpha$-$Al_2O_3$, K-$Al_2O_3$ and $\alpha$-K Multioxide Coatings on Cemented Carbides" Thin Solid films, 193/194 (1990) pp. 536-546.
Chatfield "Characterization of the Interfaces in Chemical Vapors Deposited Coatings on Cemented Carbides" RM & HM Sep. 1990, pp. 132-138.

Primary Examiner—Ellis P. Robinson
Assistant Examiner—Archene Turner
Attorney, Agent, or Firm—Burns, Doane, Swecker & Mathis

[57] ABSTRACT

Improved properties of aluminum oxide wear layers on cemented carbides and related substrates can be obtained by combining the two alumina polymorphs ($\alpha$-$Al_2O_3$ and kappa-$Al_2O_3$) as multilayers. The nucleation of $\alpha$-$Al_2O_3$ and particularly kappa-$Al_2O_3$ can be controlled by means of modification layers. According to this invention, it is thus possible to CVD-deposit an oxide multicoating layer consisting of clearly specified layers of $\alpha$-$Al_2O_3$ and kappa-$Al_2O_3$. Preferably, $\alpha$-$Al_2O_3$ is deposited first by CVD on a TiC coated cemented carbide substrate followed by the said coating layer of kappa-$Al_2O_3$.

10 Claims, 8 Drawing Sheets

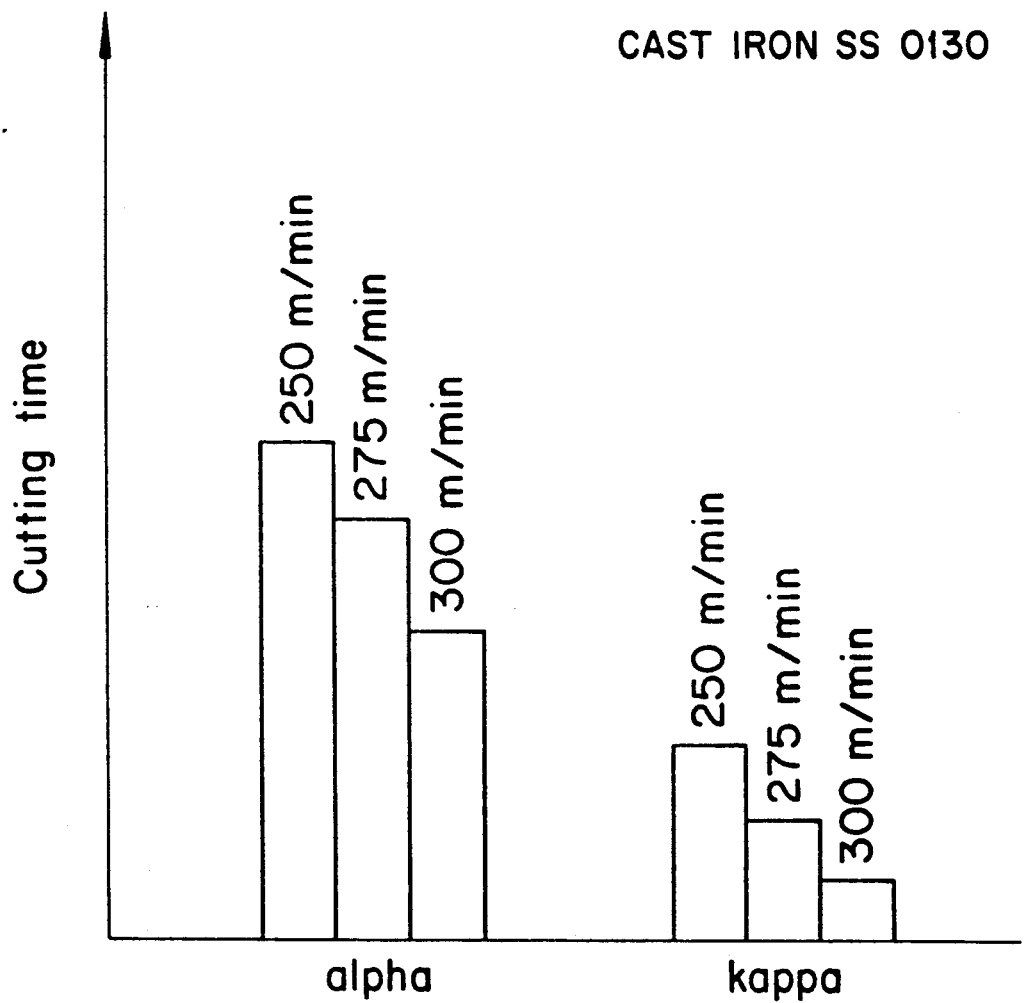

STEEL 1672

STEEL SS 2541

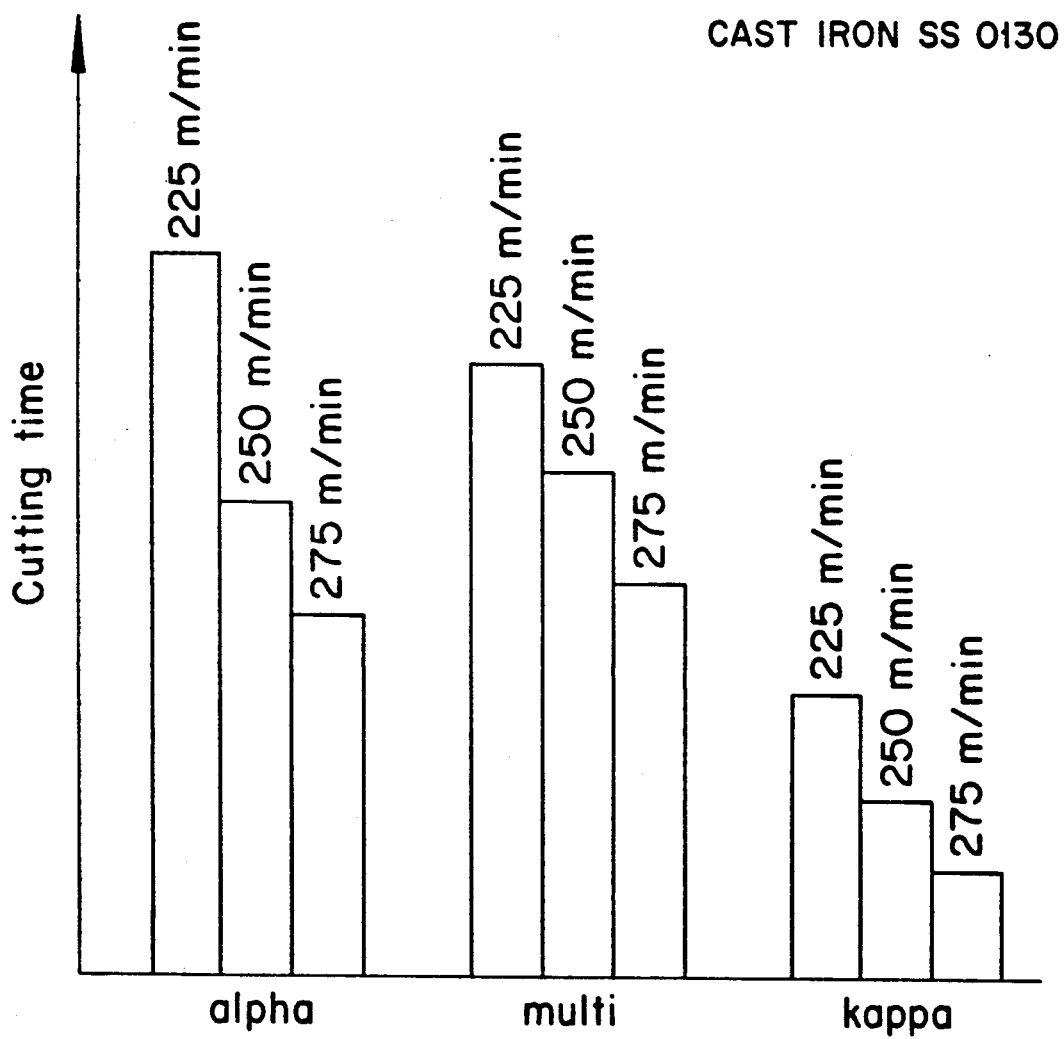

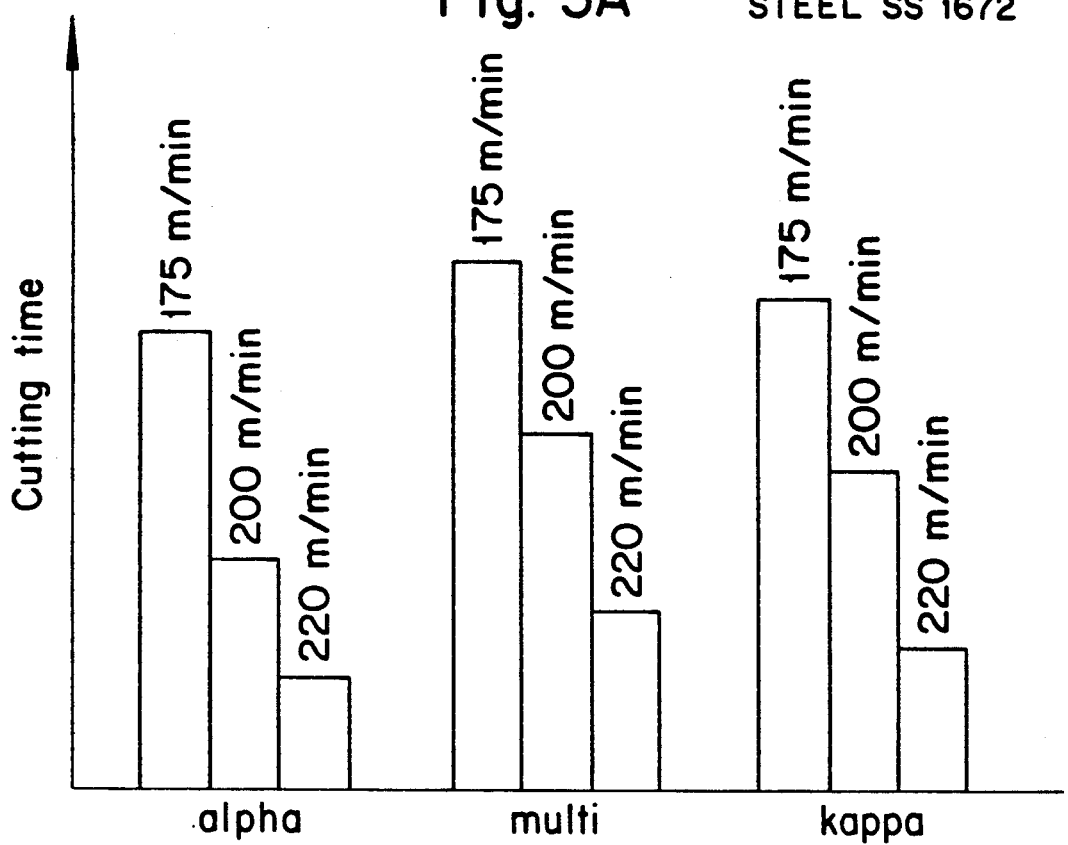
Fig. 5A  STEEL SS 1672
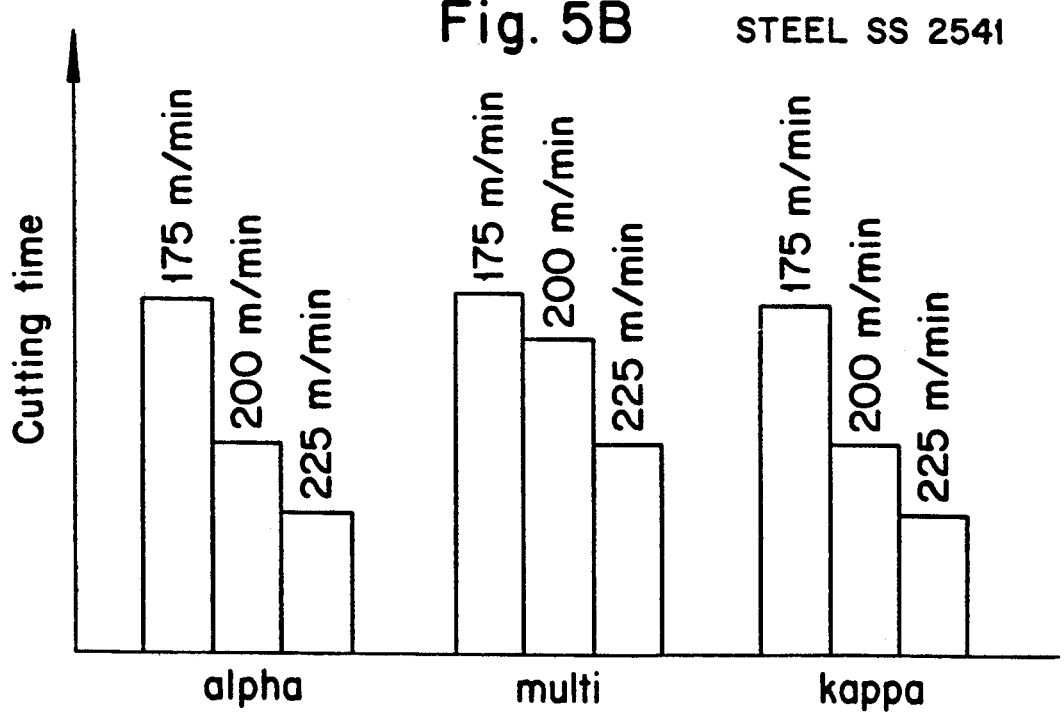
Fig. 5B  STEEL SS 2541

α/K − multi-oxide

α/K – multilayer (Thickness 10 μm)

α – oxide layer (Thickness 10 μm)

MULTI-OXIDE COATED CARBIDE BODY AND METHOD OF PRODUCING THE SAME

BACKGROUND OF THE INVENTION

1. Field of the Invention

The object of this invention is to provide a hard wear resistant multi-purpose aluminum oxide coating by combining the positive effects of both $\alpha$-$Al_2O_3$ and kappa-$Al_2O_3$ coating layers resulting in a said multipurpose grade suitable for turning and milling of, for example, both cast irons and steels with clearly improved wear properties.

2. Description of the Prior Art $Al_2O_3$ coatings can be deposited on cemented carbides applying an intermediate coating consisting of TiC, Ti(C,N), TiN or a combination of these. Alternatively the substrate may be $\gamma$-phase enriched. On top of the alumina coating a thin layer of TiN is often deposited, partly to give the tool an attractive appearance.

In addition to the alpha-$Al_2O_3$ usually referred to as corundum, alumina also exhibits several metastable allotropic modifications. These are gamma, delta, eta, theta, kappa and chi (Stumpf 1930, Thibon 1951). Only alpha exhibits an clearly established crystal structure consisting of close-packed planes of oxygen ions stacked in hcp sequence (ABAB . . .) the aluminum cations occupying two thirds of the octahedral interstices (Kronberg 1957).

The metastable alumina phases can be classified in two major groups: The alpha series, with an hcp stacking of anions like corundum, and the gamma series, with fcc oxygen stacking of a spinel type (Levi 1988). The alpha series includes chi and kappa while the gamma series consists of eta, gamma, delta and theta. In wear resistant CVD alumina coatings, the only metastable polymorph of interest - in addition to stable alpha - is kappa. The oxygen arrangement of kappa is possibly ABAC . . . type of close packing, aluminum cations being obviously also here situated in octahedral interstices. The unit cell dimensions are a=9.60 A and c=9.02 A and density 3.67 g/cm$^3$ (Okumiya et al 1971). At a higher temperature (T-1000° C.) kappa—like all metastable alumina phases—transforms into alpha, which is the equilibrium crystal structure of alumina. For kappa this transformation most probably includes both a rearrangement of aluminum cations and a large-scale rearrangement of the ABAC . . . stacking of the oxygen sublattice into the ABAB . . . stacking of oxygen in corundum (alpha alumina).

In CVD coatings, the alpha and kappa forms of alumina can often be found simultaneously since they have only slight differences in thermochemical stabilities and it is not always straightforward to nucleate and deposit coatings of pure $\alpha$-$Al_2O_3$ and especially pure kappa-$Al_2O_3$. The deposition of kappa-$Al_2O_3$ is further complicated by the kappa→alpha transformation which may occur during the CVD-process and by the fact that the nucleation of $Al_2O_3$ in the alpha modification becomes more dominant with increasing oxide coating thickness (assuming that $Al_2O_3$ has nucleated in kappa modification).

Only a few reports on the microstructure of CVD deposited alpha and kappa alumina phases can be found in the literature. It is, however, well established that $\alpha$-$Al_2O_3$ exhibits a considerably larger inherent grain size than kappa-$Al_2O_3$. Grains of alpha alumina are typically equiaxed and can grow through the whole coating layer resulting in a very large grain size of the order of 3-6 $\mu$m depending on the total alumina coating thickness. This is especially pronounced when deposition is carried out at atmospheric or high pressure (500-1000 mbar). Reduced deposition pressure (about 100 mbar) results in the grain refinement of alpha alumina with a common grain size of $\alpha$-$Al_2O_3$ formed under reduced pressure being of the order 1-2 $\mu$m. Typical crystallographic defects found in alpha alumina are dislocations and voids which occur in abundance. Linkage of voids at grain boundaries occur resulting into the formation of long channels of voids (Vuorinen 1984, 85). This obviously increases the brittleness of the alpha alumina coating. The kappa-$Al_2O_3$ coating has a grain size of the order of 0.5-1 $\mu$m and often exhibits a pronounced columnar coating morphology. In a kappa-$Al_2O_3$ coating dislocations and especially voids are almost totally absent (Vuorinen and Skogsmo 1988).

It is relatively uncomplicated to nucleate and deposit coatings of $\alpha$-$Al_2O_3$ at atmospheric pressures. As already mentioned above the resulting $\alpha$-$Al_2O_3$ coating exhibits, however, relatively very large grain size (usually clearly faceted grains) and consequently pronounced uneven coatings are obtained. These coatings are thus morphologically not very suitable for wear resistant applications. Further, the coating thickness has to be limited to 3-5 $\mu$m for the reasons mentioned above.

Kappa alumina has been claimed to exhibit good wear properties in some applications. The deposition of pure kappa-$Al_2O_3$ is, however, feasible only to limited coating thicknesses (2-3 $\mu$m). In this regard the following two complications should be considered. First, in thicker coatings even though originally nucleated as kappa-$Al_2O_3$, the kappa→$\alpha$ transformation might occur as a result of the longer deposition time (annealing). This often results in severe cracking of the alumina layer due to the fact that the alpha modification is more dense (3.99 g/cm$^3$) than the kappa modification (3.67 g/cm$^3$). The volume contraction being consequently of the order of about 8% upon transformation.

Second, as mentioned earlier, nucleation of $\alpha$-$Al_2O_3$ becomes clearly more favorable when the thickness of the oxide layer exceeds 2-3 $\mu$m. Consequently simultaneous nucleation and growth of alpha and kappa $Al_2O_3$ occur. In this case, due to differences in grain size (growth rate) of alpha and kappa modifications the coexistence of these oxides in the coating layer may result in the formation of very uneven oxide wear layers. In both cases discussed above, the boundary regions between alpha and kappa phases will constitute regions of considerable mechanical weakness.

Various prior art cutting tools (Hale's U.S. Pat. Nos. Re 32,110 and 4,608,098 and Lindstrom U.S. Pat. No. Re 31,520) employ $\alpha$-$Al_2O_3$ coatings deposited on either $\gamma$-phase enriched cemented carbides or TiC-coated cemented carbides employing also one or several bonding layers between the substrate and the $\alpha$-$Al_2O_3$ layer. While products made according to these patents reflect substantial strides over the prior art products and have enjoyed considerable commercial success, a need still arises for improvement in these techniques. For example, the deposition of $\alpha$-$Al_2O_3$ performed according to these patents at atmospheric pressures results in the uneven coating structures above unless other compounds are added to the CVD gas mixture (Smith U.S. Pat. No. 4,180,400). Furthermore these coatings usually require at least a two-stage coating process. In U.S. Pat. No. 4,180,400 a deposition process for coating consisting mainly of kappa-phase is disclosed. This process is, however, sensitive to the kappa→alpha transformation and further nucleation of kappa-$Al_2O_3$ cannot be ensured at the original nucleation surface (which is usually a TiC coated cemented carbide). The coatings produced according to this invention are thus usually consisting of both $\alpha$-$Al_2O_3$ and kappa-$Al_2O_3$. It is emphasized that the said coating always has a random distribution of $\alpha$-$Al_2O_3$ and kappa-$Al_2O_3$ and consequently by no means is any oxide multicoating layer formed. The performance of the said coating is comparable to that reported for the kappa-$Al_2O_3$ layers later on.

A method for forming an aluminum oxide coating of sufficient thickness (diffusion wear resistance), acceptable coating morphology and excellent adhesion to the underlying substrate, produced economically with simple means, has not yet been proposed.

The object of the present invention described in detail below is to provide a novel method meeting such a demand, the resulting product and a method of using that product.

DESCRIPTION OF THE FIGURES

FIG. 1 is a graph of cutting speed v. cutting time for both single $\alpha$-alumina coated inserts and kappa-alumina coated inserts used for turning of cast iron.

FIG. 4 is a graph of cutting speed v. cutting time for turning of cast iron with inserts coated either with a single $\alpha$-alumina coating, single kappa-alumina or an alpha/kappa-alumina coating of the present invention.

FIG. 5A is a graph of cutting speed v. cutting time for turning of steel SS 1672 with inserts coated either with a single $\alpha$-alumina coating, single kappa-alumina coating or an alpha/kappa-alumina coating of the present invention.

FIG. 5B is a graph of cutting speed v. cutting time for turning of steel SS 2541 with inserts coated either with a single -alumina coating, single kappa-alumina coating or an alpha/kappa-alumina coating of the present invention.

DETAILED DESCRIPTION OF THE PREFERRED EMBODIMENTS OF THE INVENTION

PRELIMINARY STUDIES

Figure 2A:
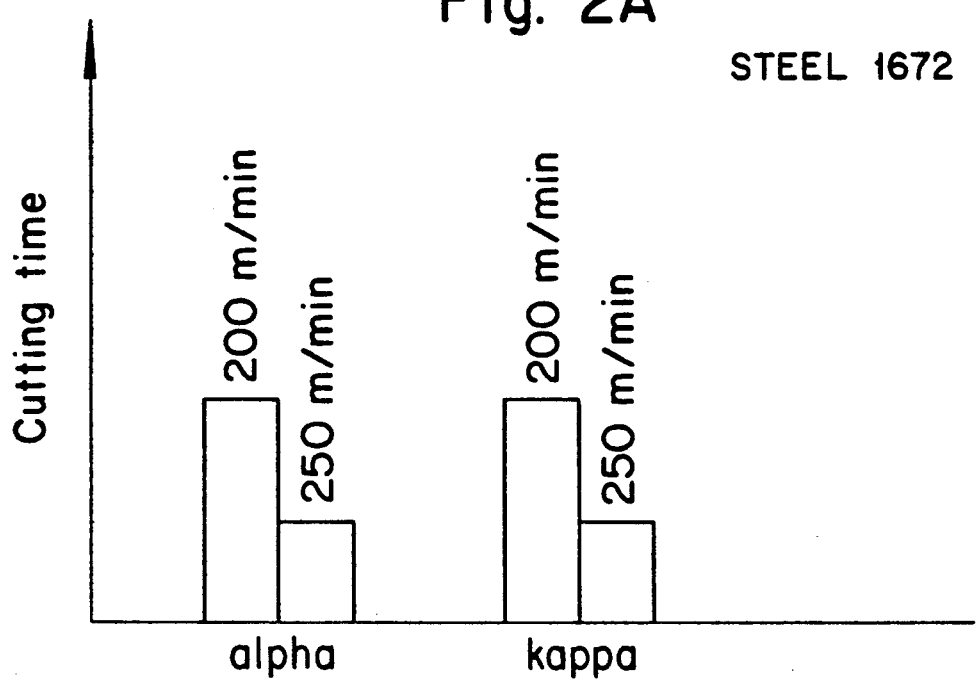
FIG. 2A is a graph of cutting speed v. cutting time for both single $\alpha$-alumina coated inserts and kappa-alumina coated inserts used for turning of steel 1672.

Coating experiments were carried out in a laboratory scale CVD-reactor which was built to meet the highest standards. The coatings were analyzed in addition to scanning electron microscopy (SEM) and x-ray diffraction (XRD) by Auger electron spectroscopy (AES) and analytical transmission electron microscopy (ATEM). It is found possible to determine—by carefully controlling the chemical nature of the substrate on which or near which the nucleation of alumina took place—which of the two alumina polymorphs of interest was obtained. This was accomplished in practice by applying two different chemically tailored modification layers. In this way an uniform nucleation of a preferred oxide modification ($\alpha$/kappa) could be obtained even though otherwise same process conditions were used. It was thus possible to deposit coatings of pure alpha and kappa (to a limited thickness) using, for example, a low-pressure CVD-process ($p \leq 50$ mbar). As mentioned earlier especially alpha alumina exhibits a more favorable coating morphology when deposited at reduced pressure. When depositing thicker coatings of pure kappa-$Al_2O_3$ the problems described earlier are still valid. In order to obtain thicker coatings of kappa-$Al_2O_3$ the deposition temperature was decreased towards the end of the coating process together with appropriate adjustment of other process parameters in order to avoid the complications described above. The coating procedures developed in the laboratory-scale CVD reactor were found to be well reproducible in the production unit.

The efforts were first concentrated to determine the wear properties of the two alumina polymorphs. Consequently 300 cemented carbide inserts were coated in a production unit with pure $\alpha$-$Al_2O_3$ and kappa-$Al_2O_3$ in two different runs using an intermediate layer of TiC. Nucleation of alpha and kappa alumina was controlled using the two different modification layers although the alpha modification layer is not necessary for the deposit of $\alpha$-$Al_2O_3$ since this form is the usual form deposited at reduced pressure. Before cutting tests the oxide phase was always checked by XRD. The obtained coatings consisted:

| | |
|---|---|
| Run No. 1: | TiC/3 $\mu$m + alpha-modification layer/0.5 $\mu$m + $\alpha$-$Al_2O_3$/10 $\mu$m |
| Run No. 2: | TiC/3 $\mu$m + kappa-modification layer/0.5 $\mu$m + kappa-$Al_2O_3$/10 $\mu$m |

The cutting test was performed in the form of continuous turning of cast iron, grade SS 0130 under the following conditions:

| Cast Iron SS 0130 (AISI A48-45B, DIN GG 30) | |
|---|---|
| Cutting speed: | 250,275,300 m/min |
| Feed: | 0.4 mm |
| Depth of cut: | 2.0 mm |
| Style of insert: | SNMA 120408 |

From the test performed (FIG. 1) it is obvious that $\alpha$-$Al_2O_3$ coating clearly outperforms the kappa-$Al_2O_3$ coatings in turning of cast iron. This was even found to be the fact even though the $\alpha$-Al$_2$O$_3$ layer was considerably thinner than the kappa-Al$_2$O$_3$ layer.

In the turning of steel the situation is completely different. The coatings produced in runs 1 and 2 were tested on two different steels SS 1672 and SS 2541 under the following conditions:

| Steel SS 1672 (AISI 4340, DIN 34CrNiMo6) | |
|---|---|
| Cutting speed: | 250 m/min, 250 m/min |
| Feed: | 0.4 mm |
| Depth of cut: | 2.5 mm |
| Style of Insert: | CNMG 120408-88MR |
| Steel SS 2541 (AISI 1045, DIN Ck45) | |
| Cutting speed: | 175 m/min, 200 m/min |
| Feed: | 0.4 mm |
| Depth of cut: | 2.5 mm |
| Style of insert: | CNMG 120408-88MR |

From the results presented in FIG. 2 it can be seen that the kappa-Al$_2$O$_3$ coatings perform as well as or even better than the $\alpha$-Al$_2$O$_3$ coatings (for the same thickness). It was also evident that the life time (performance) was mainly determined by the coating thickness alone being independent of which alumina phase the coating was composed.

The inserts coated with thick $\alpha$-Al$_2$O$_3$ (Run No. 1) showed, however, a drastic tendency for chipping which resulted in deterioration of the insert. The insert coating with thick kappa-Al$_2$O$_3$ (Run No. 2) performed well with slight or no tendency for chipping.

These coatings were, as mentioned above, outperformed by even thinner $\alpha$-oxide coatings in turning of cast iron. The only way to eliminate the brittleness and chipping tendency of $\alpha$-Al$_2$O$_3$ coated inserts is to reduce the coating thickness. This results, however, in reduced diffusion wear resistance and consequently leads in decreased life-time in steel cutting.

PREFERRED EMBODIMENTS OF THE INVENTION

Figure 3:
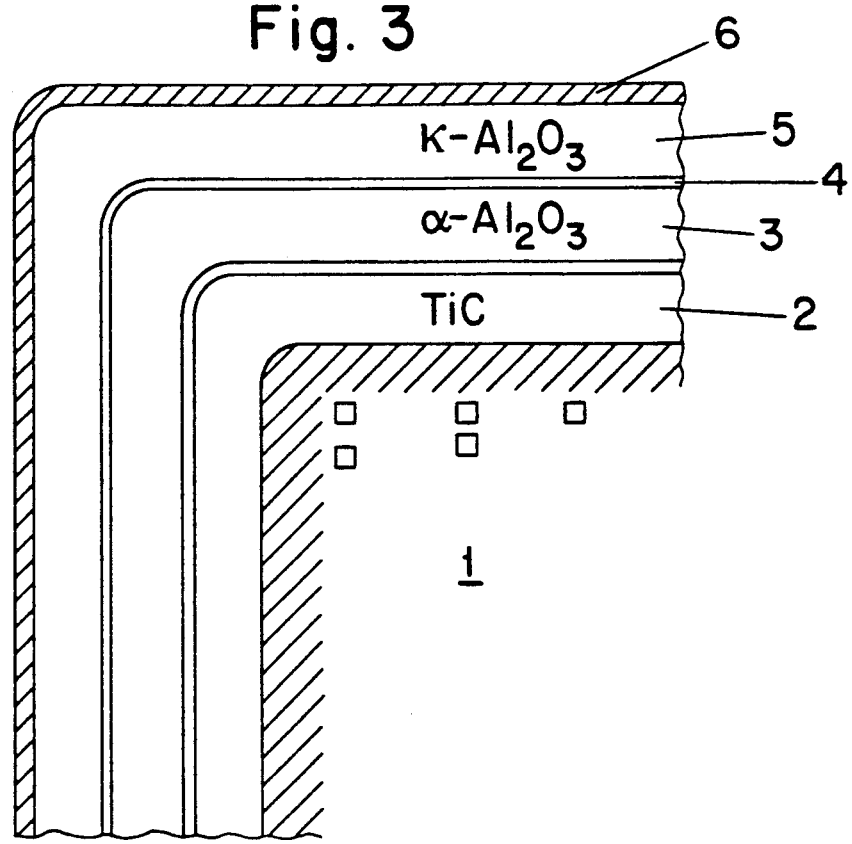
FIG. 3 is a cross-sectional representation of an insert made according to the process of the present invention.
Figure 6:
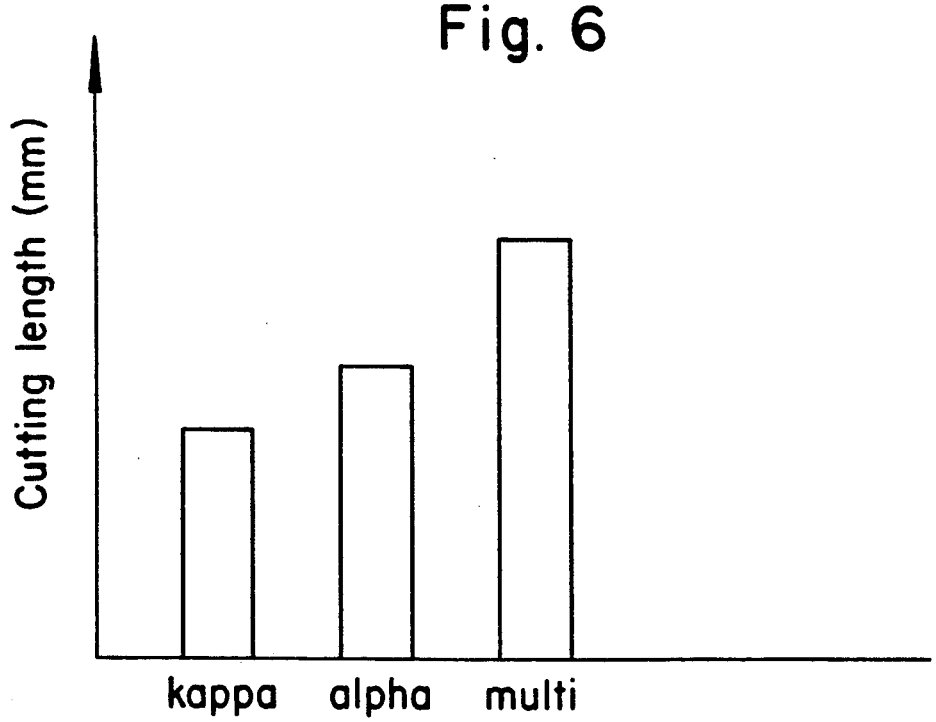
FIG. 6 is a graph of cutting length v. cutting speed for milling with inserts coated either with a single $\alpha$-alumina coating, single kappa-alumina coating or an alpha/kappa-alumina coating of the present invention.

As should be clear from the above the diffusion wear resistance of alpha and kappa aluminum oxides are similar (which is important in turning steels) while $\alpha$-Al$_2$O$_3$ coated inserts are superior in turning of cast iron. Thicker $\alpha$-Al$_2$O$_3$ coatings, even though performing well, suffered from severe chipping in steel cutting operations. The novel idea of this invention is to combine the positive effects of $\alpha$- and kappa-oxides in a multilayer coating. According to the present invention there is provided an article of manufacture comprising the following, schematically shown in FIG. 3:

1. a hard metal or cemented carbide substrate.

2. an inner layer next to the substrate comprising a thin intermediate layer of wear resistant carbide, nitride carbonitride, carbooxide, carbooxynitride and/or boride, of one or more of the elements Ti, Zr, Hf, V, Nb, Ta, Cr, Mo, W, Si and/or B, preferably of titanium carbide, having a thickness of 1 to 5 $\mu$m, preferably 3 $\mu$m.

3. an $\alpha$-alumina wear layer deposited as described above under "Preliminary Studies" having a thickness of 2 to 15 $\mu$m, preferably 8 $\mu$m.

4. a kappa-modification layer overlying the said $\alpha$-alumina layer. This layer is a thin (0.05-0.5 $\mu$m, preferably 0.05-0.1 $\mu$m) surface oxidized layer of (Al$_x$Ti$_y$)(O$_w$C$_z$) deposited via CVD on $\alpha$-Al$_2$O$_3$, where y:x=2-4; z:w=0.6-0.8.

5. a kappa-alumina layer overlying the said kappa-modification layer and the said $\alpha$-alumina layer, having a thickness of 1-6 preferably 3 $\mu$m.

6. an optional TiN layer overlying the said kappa-Al$_2$O$_3$ layer mainly for decorative purposes, having a thickness of 0.5-2 $\mu$m preferably 1 $\mu$m.

According to this invention a multi-purpose grade is thus supplied consisting of $\alpha$-alumina layer properly bonded to (preferably) a TiC-layer. Onto the $\alpha$-alumina layer, a layer of kappa-alumina is deposited via a modification layer. The modification layer enables the nucleation and growth of kappa-Al$_2$O$_3$ and $\alpha$-Al$_2$O$_3$. It is well known that when depositing polymorphs with only slight differences in thermochemical stabilities the nucleation process controls the phase composition of the coating. According to this invention the kappa modification layer (4) ensures the nucleation of kappa-Al$_2$O$_3$ on $\alpha$-Al$_2$O$_3$. The alpha-modification layer can also be applied on the kappa-Al$_2$O$_3$ layer in order to ensure nucleation of $\alpha$-Al$_2$O$_3$ on kappa-Al$_2$O$_3$ although the alpha modification layer is not necessary for the deposit of $\alpha$-Al$_2$O$_3$ since this form is the usual form deposited at reduced pressure. Similarly, the alpha modification layer, if desired, can be applied to the thin, intermediate layer prior to deposit of the $\alpha$-alumina layer 3.

Also, one of the modification layers referred to above can be applied several times during the oxide deposition resulting in a multicoating of successive layers of $\alpha$-Al$_2$O$_3$ or kappa-Al$_2$O$_3$, respectively. Consequently it is possible to deposit multicoatings consisting of the two alumina polymorphs, even as alternating layers if so desired.

The process of the present invention can be used on any conventional cemented carbide substrate as known in the art. Typically, such substrates are comprised of a major part of a metal carbide such as tungsten carbide with minor additions, if desired, of, for example, TiC, NbC, HfC, VC or the like with an iron group metal binder, preferably cobalt.

The benefits of the invention are as follows:

(a) The $\alpha$-Al$_2$O$_3$ layer is responsible for good performance of the insert in cast iron. The superiority of $\alpha$-Al$_2$O$_3$ in the machining or cast iron is due to the facts that in turning materials forming short chips like cast iron the cutting forces are acting over a smaller area of the cutting insert and closer to the cutting edge compared with turning of steel. The cutting speeds used for machining cast iron are also higher than in steel machining operations. In cast iron turning, the conditions (higher local temperature, pressure) are thus more thermodynamically controlled than in turning of steel. Consequently, the stable alumina polymorph, $\alpha$-Al$_2$O$_3$, should be superior to kappa alumina in turning of cast iron. This is just what the present experiments have confirmed. Further, $\alpha$-Al$_2$O$_3$ can strongly be bonded to a TiC layer according to this invention.

One hypothetical explanation is that the kappa$\rightarrow$$\alpha$ transformation could occur during turning of cast iron due to locally high temperature together with mechanical constraints (high pressure). This should lead to the flaking of the kappa-oxide layer. In conclusion: studies on the wear mechanisms performed support the idea that the $\alpha$-Al$_2$O$_3$ layer being the thermodynamically stable alumina polymorph can also extremely tightly be bonded to the TiC underlayer. The fact that kappa-Al$_2$O$_3$ can strongly be bonded to alpha alumina enables the disclosed oxide multilayer invention and also explains the good performance of α/kappa-multicoating.

(b) By choosing the α-Al$_2$O$_3$ to be the first oxide layer having the maximum thickness in respect of brittleness (5-6 μm) the difficulties with kappa→α transformation can be avoided in that specific part of the oxide coating which is suspected to have the longest annealing during the CVD.

(c) The thickness (diffusion wear resistance) of the oxide wear layer can be kept at a sufficient level (about 10 μm) or even increased without sacrificing toughness of the insert (tendency of chipping) by applying a thin 1-3 μm thick layer of kappa-Al$_2$O$_3$ on a previously deposited α-Al$_2$O$_3$ or preferably substituting the (outermost) part of the α-Al$_2$O$_3$ layer by a layer of kappa-Al$_2$O$_2$. It is shown later on that the tendency for chipping could be drastically reduced by a thin layer of kappa-Al$_2$O$_3$ deposited on α-Al$_2$O$_3$. This is obviously due to the more favorable morphology and internal structure (presence of no pores or microcracks) exhibited by kappa-Al$_2$O$_3$.

(d) By choosing the kappa-oxide layer to be the outermost layer of the multioxide coating, i.e., as a layer which is suspected to have the shortest annealing during the CVD, the problems with the kappa→α transformation can be minimized. Further, the surface quality of the kappa-Al$_2$O$_3$ layer is considerably better than that of α-Al$_2$O$_3$. This enables the surface coating of, for example, TiN to be expeditiously deposited on the oxide multilayer.

The oxide multi-coatings claimed are characterized by the fact that the modification layers within the oxide multi-coating layers (mainly used to control nucleation of alpha phase and particularly the kappa phase) are extremely thin and do not contribute significantly to the total thickness of the oxide multi-coating layer. The total thickness of the modification layer(s) within the oxide-coating is consequently always less than about 20%, preferably about 10%, of the total thickness of the aluminum oxide multi-coating layer.

By exercising the above described method it is possible to have a multiplicity of oxide coatings with controlled structure and with optimized sequence and properties for different application such as kappa-alpha-kappa or alpha-kappa-alpha on the substrate.

EXAMPLES

The invention is additionally illustrated in connection with the following Examples which are to be considered as illustrative of the present invention. It should be understood, however, that the invention is not limited to the specific details of the Examples.

EXAMPLE 1:

Commercial cemented carbide inserts of composition 85.5 WC, 6% TaC, 2/5% TiC and 5.5% Co were coated under the coating conditions specified in the following (RUN 3):

| Step 1, TiC coating | |
| --- | --- |
| gas mixture: | TiCl$_4$: 3.5% |
| | CH$_4$: 5.5% |
| | balance: H$_2$ |
| duration: | 130 minutes |
| temperature: | 1020° C. |
| pressure: | 50 mbar |
| Step 2, alpha alumina coating | |
| gas mixture: | AlCl$_3$: 2.1% |
| | CO$_2$: 3/7% |
| | H$_2$S: 0.01% |
| | Ar: 5% |
| | balance: H$_2$ |
| duration: | 9 hours |
| pressure: | 50 mbar |
| temperature: | 1060° C. |

This treatment resulted in the following coating structure:
1. TiC coating, thickness 3 μm from step 1
2. alpha-Al$_2$O$_3$ layer 10 μm

EXAMPLE 2 (RUN 4)

The same substrate as mentioned in Example 1 was treated in the following manner:

RUN 4

Step 1 as above
Step 3 as above, coating time 7 hours

| Step 3, Kappa-modification layer | |
| --- | --- |
| gas mixture: | TiCl$_4$: 2.8% |
| | AlCl$_3$: 3.2% |
| | CO: 5.8% |
| | CO$_2$: 2.2% |
| | balance: H$_2$ |
| duration: | 5 minutes |
| temperature: | 1060° C. |
| pressure: | 60 mbar |

This treatment was followed by surface oxidizing step (3.5% CO$_2$, balance H$_2$) 1 minute.

| Step 4, kappa alumina coating | |
| --- | --- |
| gas mixture: | as in Step 3 |
| duration: | 2 h |
| temperature: | 1060° C. |
| pressure: | 50 mbar |

Figure 7:
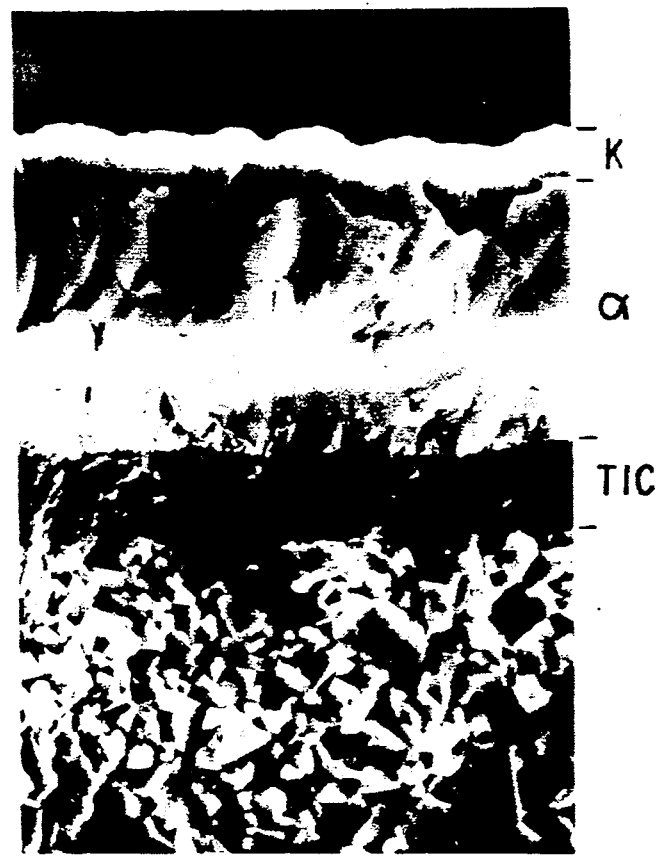
FIG. 7 is a cross sectional scanning electron micrograph of an alpha/kappa multi-layer insert of the present invention.

This treatment resulted in the following coating structure (FIG. 7):
1. TiC coating, thickness 3 μm
2. alpha-Al$_2$O$_3$-layer, thickness 8 μm
3. Kappa-modification layer, thickness ≦0.1 μm
4. kappa-Al$_2$O$_3$ layer, thickness 2 μm

EXAMPLE 3

The coating produced in Runs 3 and 4 were tested together with an insert having a single alumina coating (as produced in Run 2).

The cutting tests were performed in continuous turning as the following work piece materials under the give conditions:

| Cast Iron: SS 0130 (AISI A48-45B, DIN GG30) | |
| --- | --- |
| Cutting speeds: | 225,250,275 m/min |
| Feed: | 0.4 mm |
| Depth of cut: | 2.0 mm |
| Style of insert: | CNMG 120408-88MR |
| Steel (1): SS 1672 (AISI 4340, DIN 34CrNiMo6) | |
| Cutting speeds: | 175,300 m/min |
| Feed: | 0.4 mm |
| Depth of cut: | 2.5 mm |
| Style of insert: | CNMG 120408-88MR |
| Steel (2): SS 2541 (AISI 1045, DIN Ck45) | |
| Cutting speed: | 175,200 m/min |

| | |
|---|---|
| Feed: | 0.4 mm |
| Depth of cut: | 2.5 mm |
| Style of insert: | CNMG 120408-88MR |

Figure 2B:
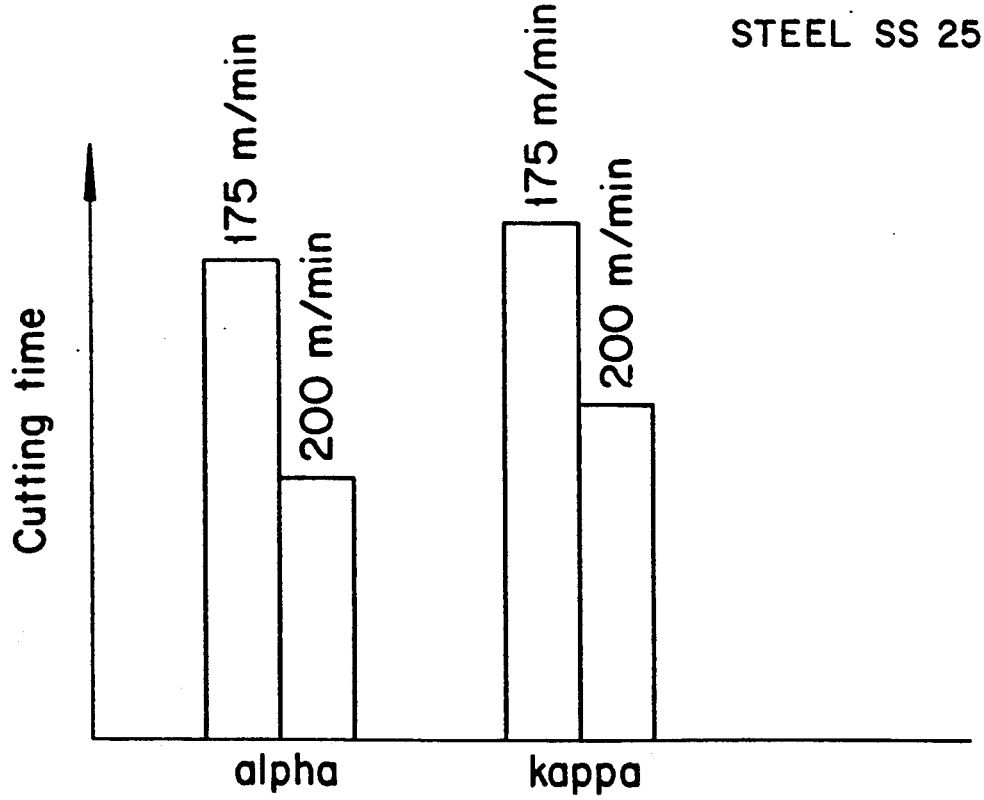
FIG. 2B is a graph of cutting speed v. cutting time for both single -alumina coated inserts and kappa-alumina coated inserts used for turning of steel SS 2541.

It is emphasized that the thicknesses of the oxide coating layers as well as total coating thicknesses were thus equal for all the inserts tested. Results presented in FIGS. 4, 5A, 5B and 6 as well as in FIGS. 1, 2A and 2B are based on a large number of tests. Consequently, each test result reported here for a specific coating type thus represents the average of several cutting edges.

The results clearly demonstrate that the alpha/kappa multicoating performs well in both cast iron and steel applications. It should also be noted that the performance of the oxide multicoating is clearly getting better with higher cutting speeds. As shown later on the benefits of the oxide multicoating layer are not limited to higher cutting speeds.

EXAMPLE 4

Figure 8:
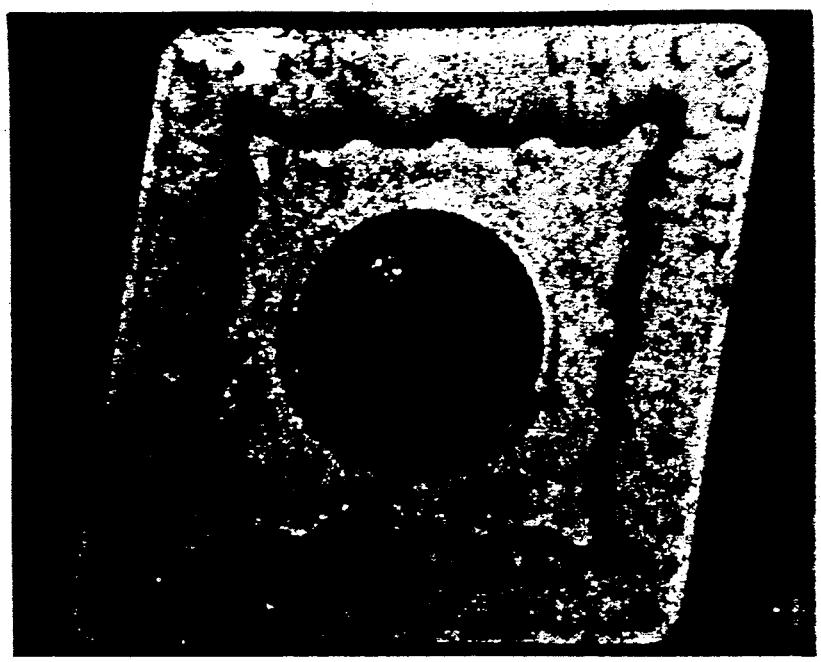
FIGS. 8 and 9 are photomicrographs of alpha/kappa oxide multi-layer coated and single alpha oxide coated inserts after extreme copying operations on steel.
Figure 9:
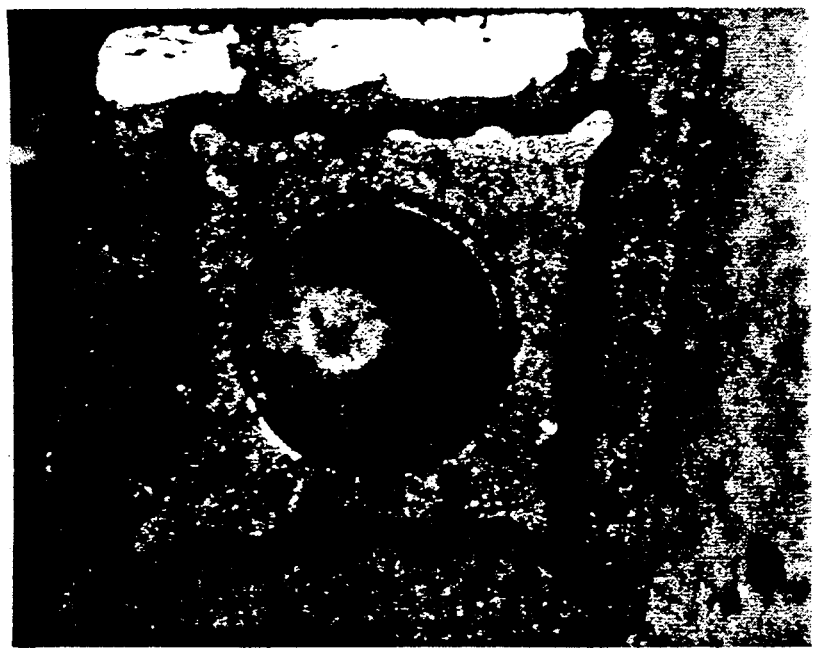

Coated inserts from Runs 3 and 4 were tested in extreme copying operations of steel in order to compare the tendencies for chipping. Photomicrographs of the insert after the test are shown below (FIGS. 8 and 9). The conditions were:

| | |
|---|---|
| Material: | SS1671 (AISI 4340, DIN 34CrNiMo6) |
| Cutting speeds: | 200 m/min |
| Feed: | 0.28 mm |
| Depth of cut: | 2.5 mm |
| Style of insert: | CNMG 120408-88MR |

As clearly can be seen the $\alpha$/kappa-$Al_2O_3$ multi-coating suffered from chipping much less than the insert having the single $\alpha$-$Al_2O_3$ layer. In fact, the insert with the single $\alpha$-$Al_2O_3$ layer was deteriorated during the test while the $\alpha$/kappa-multicoated insert could be used further.

EXAMPLE 5

Figure 10:
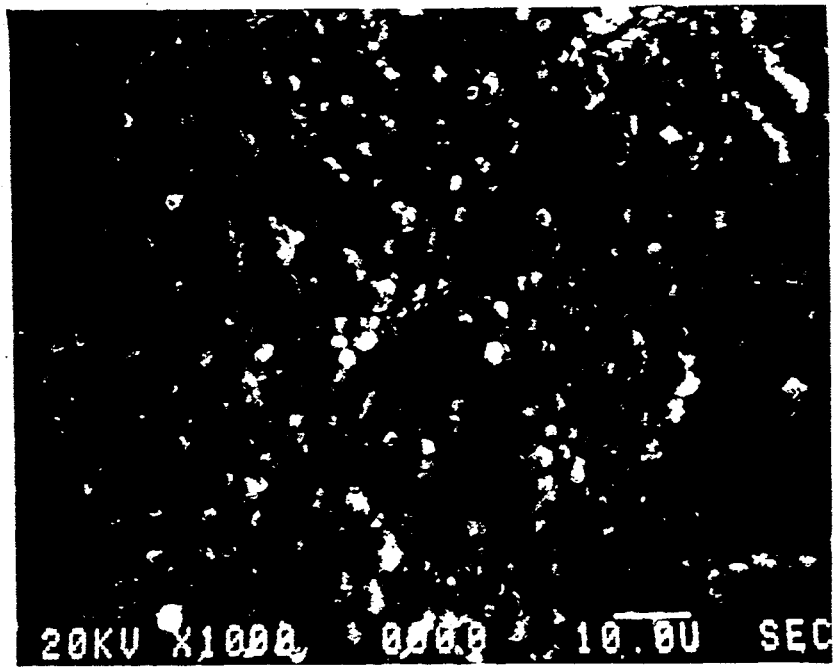
FIGS. 10 and 11 are scanning electron micrographs showing the surface morphologies of an alpha/kappa oxide multi-layer and a single alpha oxide layer.
Figure 11:
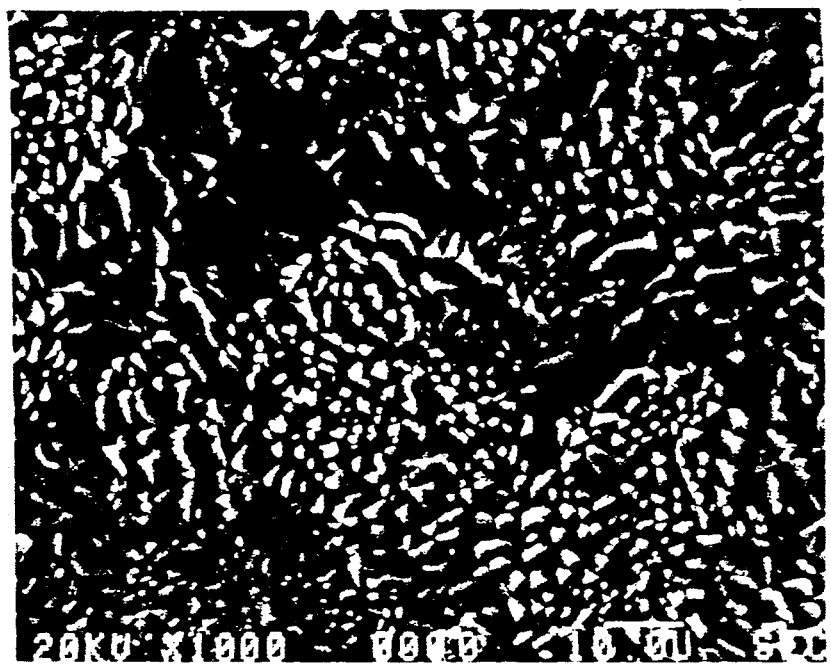

The surface quality of the inserts coated in Runs 3 and 4 were compared. Even though clear differences were obvious based only on visual inspection, scanning electron micrographs clearly demonstrate the better surface quality of $\alpha$/kappa-multicoated oxide wear layer (FIGS. 10 and 11). This insert could be TiN-coated with good (decorative) results.

EXAMPLE 6

A cemented carbide insert having the same composition as Example 1 above was coated in the following way using the process parameters explained in detail in Examples 1 and 2 respectively.
1. TiC coating (thickness 3 $\mu$m)
2. $\alpha$-$Al_2O_3$-layer (thickness 2 $\mu$m)
3. Kappa-modification-layer (thickness $\leq$ 0.1 $\mu$m)
4. Kappa-$Al_2O_3$ layer (thickness 2 $\mu$m)
5. Alpha-modification layer as in Run 1, about 0.2 $\mu$m, ensuring the nucleation of $\alpha$-$Al_2O_3$ on kappa-$Al_2O_3$.
6. $\alpha$-$Al_2O_3$ layer (thickness 2 $\mu$m)
7. Kappa-modification layer, as in Step 3 above.
8. Kappa-$Al_2O_3$ layer (thickness 2 $\mu$m)

As shown by this example, a different modification layer, alpha-modification layer can be used to renucleate $\alpha$-$Al_2O_3$ on kappa-$Al_2O_3$. In this case, for example, an oxide multicoating consisting of the following layers was obtained.

| |
|---|
| alpha-$Al_2O_3$, 2 $\mu$m |
| kappa-$Al_2O_3$, 2 $\mu$m |
| alpha-$Al_2O_3$, 2 $\mu$m |
| kappa-$Al_2O_3$, 2 $\mu$m | firmly bonded to the cemented carbide substrate and each other. When tested on cast iron, the performance of this coating was found to be in between of the $\alpha$/kappa-multicoating (Run 4) and kappa-$Al_2O_3$ coating (Run 5). It, however, should be noted that the described coating clearly outperformed commercial oxide coatings.

EXAMPLE 7

As mentioned above, nucleation of alumina in the alpha modification dominates when the thickness of the kappa layer exceeds 2-3 $\mu$m. Consequently, the kappa-modification layer can be used to renucleate kappa alumina. In this way thick coatings of largely pure kappa alumina can be obtained as described below (the process parameters are the same as in Example 6).
1. TiC (thickness 3 $\mu$m)
2. Kappa alumina as in Run 2 but thinner (thickness 2 $\mu$m)
3. Kappa-modification layer (thickness $\leq$ 0.1 $\mu$m)
4. Kappa alumina (thickness 2 $\mu$m)
5. Kappa-modification layer (thickness $\leq$ 0.1 $\mu$m)
6. Kappa alumina (thickness 2 82 m)
7. Kappa-modification layer (thickness $\leq$ 0.1 $\mu$m)
8. Kappa alumina (thickness 2$\mu$m)
9. Kappa-modification layer (thickness $\leq$ 0.1 $\mu$m)
10. Kappa alumina (thickness 2 $\mu$m)

A thick multicoating (about 10 $\mu$m) of almost pure kappa alumina tightly bonded via the TiC-layer to the substrate was obtained by properly adjusting the process parameters so that the kappa$\rightarrow$alpha transformation could be eliminated despite the relatively long deposition.

It should be emphasized that the oxide multicoating is mainly consisting of kappa alumina. The total thickness of the four modification layers within the oxide coating being of the order of 5% in this case and always less than 20% and preferably less than 10% of the total thickness of the oxide coating layer. The modification layers which are used for nucleation control are thus not markedly contributing to the total thickness of the multioxide coating. This is characteristic for all the coatings produced according to this invention.

EXAMPLE 8

The better performance of alpha/kappa multioxide coating over the conventional alpha and kappa single coatings could also be clearly demonstrated in milling of cast iron.

The milling test was performed in cast iron grade SS 0130 (AISI A48-45B, DIN GG 30) under the following conditions.

| | |
|---|---|
| Cutting speed: | 425 m/min |
| Depth of cut: | 2.5 mm |
| Feed: | 0.2 mm |

In addition to longer life-time (FIG. 6) the alpha-/kappa multioxide coating clearly exhibited a reduced tendency for edge chipping.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without department from the spirit of the invention.

I claim:

1. A coated sintered cemented carbide body having a substrate containing at least one metal carbide and a binder metal and a coating having a plurality of layers, at least one of said layers consisting essentially of $\alpha$-alumina and another of said layers consisting essentially of kappa-alumina wherein a kappa-modification layer is disposed between the $\alpha$-alumina and kappa-alumina layers, said kappa-modification layer being $(Al_xTi_y)(O_2C_z)$ wherein $y:x=2-4$ and $z:w=0.6-0.8$, the total thickness of the modification layer being less than 20% of the total thickness of the coating, wherein the $\alpha$-alumina layer has a thickness of from 2-15 $\mu$m and the kappa-alumina layer has a thickness of from 1-6 $\mu$m, and the substrate has a layer of carbide, nitride, carbooxynitride, carbooxide or carbonitride of one or more of the elements Ti, Zr, Hf, V, Nb, Ta, Cr, Mo, W, Si and/or B between the substrate and an alumina layer.

2. The coated sintered cemented carbide of claim 1 wherein the kappa-alumina layer overlies the $\alpha$-alumina layer.

3. The coated sintered cemented carbide of claim 1 wherein the kappa-modification layer is from 0.05-0.5 $\mu$m thick.

4. The coated sintered cemented carbide of claim 1 wherein the coating has an outermost layer of titanium nitride having a thickness of 0.5-2 $\mu$m.

5. The coated sintered cemented carbide of claim 1 wherein there is a plurality of layers of kappa-alumina or $\alpha$-alumina with a kappa-modification layer dispersed between each layer of $\alpha$-alumina and a layer of kappa-alumina.

6. A method of cutting cast iron using the coated sintered cemented carbide body of claim 1.

7. A coated sintered cemented carbide having a substrate containing at least one metal carbide and a binder metal and a coating having a plurality of layers, at least one layer consisting essentially of $\alpha$-alumina and at least one other layer consisting essentially of kappa-alumina the improvement wherein the outermost operative layer consists essentially of kappa-alumina, wherein a kappa-modification layer is disposed between the $\alpha$-alumina and kappa-alumina layers, said kappa-modification layer being $(Al_xTi_y)(O_wC_z)$ wherein $y:x=2-4$ and $z:w=0.6-0.8$, the total thickness of the modification layer being less than 20% of the total thickness of the coating, the $\alpha$-alumina layer has a thickness of from 2-15 $\mu$m and the kappa-alumina layer has a thickness of from 1-6 $\mu$m, and the substrate has a layer of carbide, nitride, carbooxynitride, carbooxide or carbonitride of one or more of the elements Ti, Zr, Hf, V, Nb, Ta, Cr, Mo, W, Si and/or B between the substrate and an alumina layer.

8. A coated sintered cemented carbide of claim 1 wherein the total thickness of the modification layer is less than 10% of the total thickness of the coating.

9. A coated sintered cemented carbide of claim 5 wherein the total thickness of the modification layer is less than 20% of the total thickness of the coating.

10. A coated sintered cemented carbide of claim 9 wherein the total thickness of the modification layer is less than 10% of the total thickness of the coating.

* * * * *